(12) United States Patent
Noguchi

(10) Patent No.: US 11,177,348 B2
(45) Date of Patent: Nov. 16, 2021

(54) SILICON CARBIDE SEMICONDUCTOR DEVICE

(71) Applicant: Mitsubishi Electric Corporation, Tokyo (JP)

(72) Inventor: Munetaka Noguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/968,872

(22) PCT Filed: Nov. 29, 2018

(86) PCT No.: PCT/JP2018/044006
§ 371 (c)(1),
(2) Date: Aug. 11, 2020

(87) PCT Pub. No.: WO2019/171678
PCT Pub. Date: Sep. 12, 2019

(65) Prior Publication Data
US 2021/0013308 A1 Jan. 14, 2021

(30) Foreign Application Priority Data
Mar. 7, 2018 (JP) .............................. JP2018-040545

(51) Int. Cl.
*H01L 29/10* (2006.01)
*H01L 29/16* (2006.01)
(Continued)

(52) U.S. Cl.
CPC ...... *H01L 29/1033* (2013.01); *H01L 29/1608* (2013.01); *H01L 29/18* (2013.01); *H01L 29/4236* (2013.01)

(58) Field of Classification Search
CPC .......... H01L 29/66545; H01L 29/1033; H01L 29/7395; H01L 29/7397; H01L 29/4236; H01L 29/1608
See application file for complete search history.

(56) References Cited

U.S. PATENT DOCUMENTS 10,217,811 B1 * 2/2019 Shimizu ................ H01L 21/045
10,347,735 B2 * 7/2019 Kumada ........... H01L 29/42356
(Continued)

FOREIGN PATENT DOCUMENTS

| JP | 2004-363398 A | 12/2004 |
|----|---------------|---------|
| JP | 2013-219161 A | 10/2013 |

(Continued)

OTHER PUBLICATIONS

International Search Report and Written Opinion dated Feb. 12, 2019 for PCT/JP2018/044006 filed on Nov. 29, 2018, 11 pages including English Translation of the International Search Report.
(Continued)

*Primary Examiner* — Changhyun Yi
(74) *Attorney, Agent, or Firm* — Xsensus LLP

(57) ABSTRACT

In a SiC-MOSFET, to increase the threshold voltage while reducing the channel resistance is difficult. And, when the channel resistance is lowered, the reliability may be reduced in such a manner that a current may flow when the device is turned off and malfunction may occur when the device is used as a normally-off device. According to the present invention, the threshold voltage is increased while the channel resistance is reduced, and reliability when used as a normally-off device is improved by adding at least any of sulfur, selenium, and tellurium to the channel region of the SiC MOSFET.

18 Claims, 9 Drawing Sheets

(51) Int. Cl.
*H01L 29/18* (2006.01)
*H01L 29/423* (2006.01)

(56) References Cited

U.S. PATENT DOCUMENTS

| | | |
|---|---|---|
| 2012/0199850 A1 | 8/2012 | Honaga et al. |
| 2017/0250254 A1 | 8/2017 | Tanioka et al. |
| 2018/0083112 A1 | 3/2018 | Shimizu et al. |

FOREIGN PATENT DOCUMENTS

| | | |
|---|---|---|
| JP | 2018-046246 A | 3/2018 |
| WO | 2011/089687 A1 | 7/2011 |
| WO | 2016/071990 A1 | 5/2016 |

OTHER PUBLICATIONS

Ueno, K. and Oikawa, T., "Counter-Doped MOSFET's of 4H-SiC," IEEE Electron Device Letters, vol. 20, No. 12, Dec. 1999, pp. 624-626.

Japanese Office Action dated Sep. 14, 2021 in Application No. 2020-504785.

\* cited by examiner

F I G. 1 7
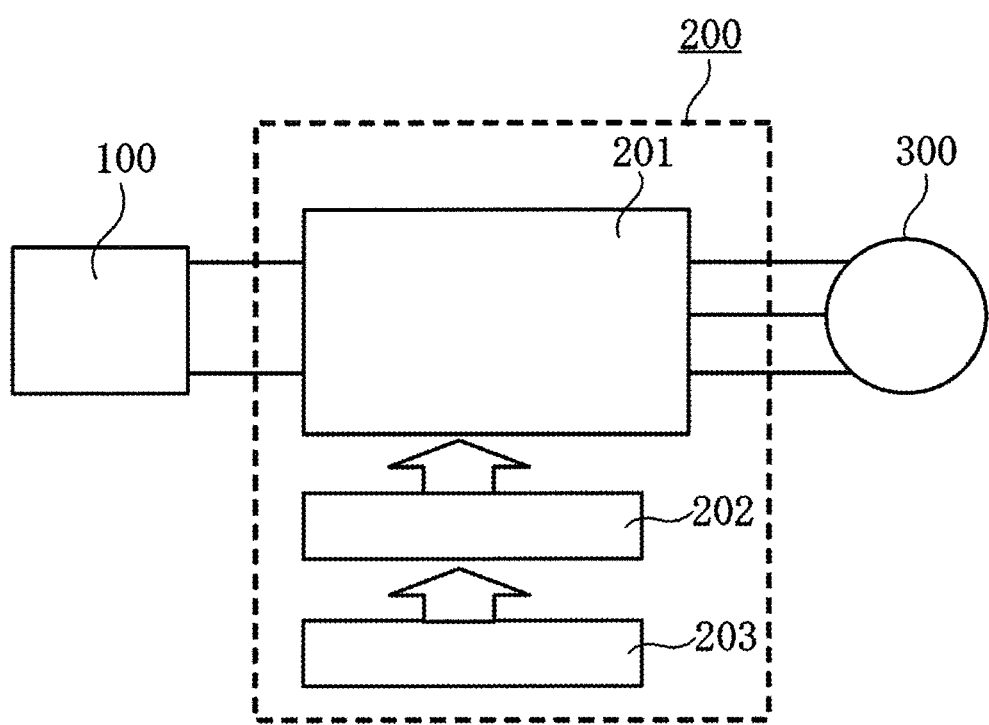

SILICON CARBIDE SEMICONDUCTOR DEVICE

CROSS-REFERENCE TO RELATED APPLICATIONS

The present application is based on PCT filing PCT/JP2018/044006, filed Nov. 29, 2018, which claims priority to JP 2018-040545, filed Mar. 7, 2018, the entire contents of each are incorporated herein by reference.

TECHNICAL FIELD

The present invention relates to a silicon carbide semiconductor device composed of silicon carbide, a manufacturing method of the same, and a power conversion apparatus.

BACKGROUND ART

In an insulated gate field effect transistor (Metal-Oxide-Semiconductor Field-Effect-Transistor: MOSFET) using silicon carbide, many electrical defects exist at the interface between the gate insulating film and the semiconductor layer: therefore, the problem is that the channel resistance increases. Therefore, for example, measures such as a method of reducing channel resistance by introducing nitrogen near the interface between the gate insulating film and the semiconductor layer have been conceived (for example, Patent Document 1). As described above, it has been known that when the nitrogen concentration at the interface between the gate insulating film and the semiconductor layer is increased, the threshold voltage of the MOSFET generally decreases. When the threshold voltage of the MOSFET lowers, the reliability may be reduced in such a manner that, for example, a current may flow when the device is in a off state and malfunction may occur even when the device is used as a normally-off device.

Further, in order to prevent the silicon carbide semiconductor layer from being oxidized when the gate insulating film is formed, an oxidation prevention layer containing impurities such as nitrogen, fluorine, sulfur, and selenium is formed on the silicon carbide semiconductor layer side of the gate insulating film (for example, Patent Document 2).

PRIOR ART DOCUMENTS

Patent Documents

[Patent Document 1] WO2011/089687
[Patent Document 2] Japanese Patent Application Laid-Open No. 2004-363398

SUMMARY

Problem to be Solved by the Invention

However, in the methods of Patent Documents 1 and 2, even if the defects at the interface between the gate insulating film and the semiconductor layer can be reduced, the threshold voltage of the MOSFET is reduced, and when the threshold voltage of the MOSFET is set high, the channel resistance is increased. Accordingly, it has not been achieved to satisfy both the reduction in the channel resistance and the increase in the threshold value of the MOSFET.

Means to Solve the Problem

According to the present invention, a silicon carbide semiconductor device includes a semiconductor substrate composed of silicon carbide, a drift layer formed on the semiconductor substrate and composed of a silicon carbide semiconductor of n-type, a well region of p-type formed on a surface layer of the drift layer, a source region of n-type formed on a surface in the well region and separated from the drift layer, a gate insulating film formed in contact with the source region, the well region, and the drift layer, a gate electrode formed in contact with the gate insulating film and opposite to the well region, a source electrode connected to the source region, and a drain electrode connected to the semiconductor substrate. Sulfur is contained in the well region within a predetermined thickness from an interface of the well region with the gate insulating film.

Effects of the Invention

According to the silicon carbide semiconductor device of the present invention, a threshold voltage can be increased while suppressing an increase in on-resistance, so that a highly reliable semiconductor device with low resistance and low loss can be provided.

BRIEF DESCRIPTION OF DRAWINGS

FIG. 17 A schematic diagram illustrating a configuration of a power conversion apparatus according to Embodiment 4 of the present invention.

DESCRIPTION OF EMBODIMENTS

Figure 1:
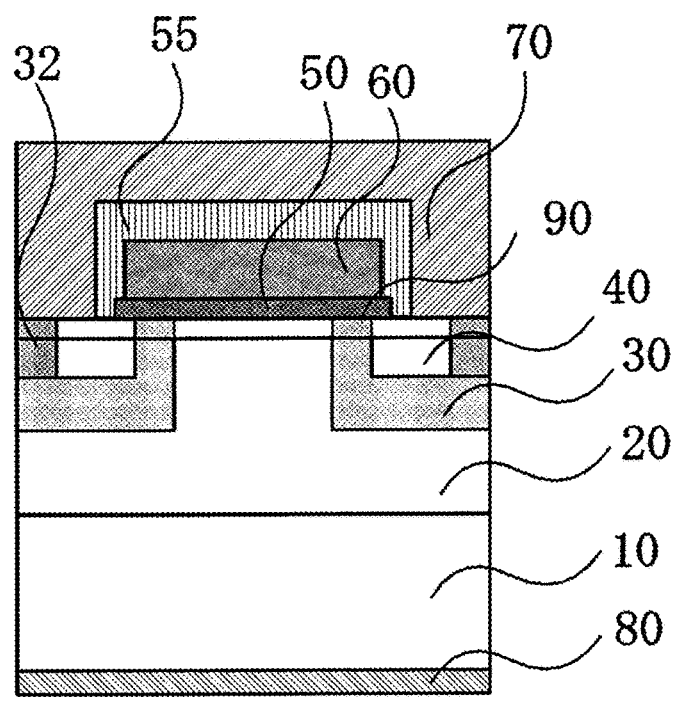
FIG. 1 A schematic cross-sectional view of a silicon carbide semiconductor device according to Embodiment 1 of the present invention.

Hereinafter, Embodiments will be described with reference to the accompanying drawings. It should be noted that the drawings are schematically illustrated, and the sizes and the interrelationships between and positions of the images illustrated in different drawings are not necessarily accurately drawn and can be changed as appropriate. In the following description, similar components are denoted by the same reference numerals, and have the same names and functions. Accordingly, detailed descriptions thereof may be omitted.

Embodiment 1

First, the configuration of a silicon carbide semiconductor device according to Embodiment 1 of the present invention will be described.

FIG. 1 is a schematic cross-sectional view of a silicon carbide MOSFET (SiC-MOSFET) that is a silicon carbide semiconductor device according to Embodiment 1.

In FIG. 1, a drift layer 20 composed of n-type silicon carbide is formed on a surface of a semiconductor substrate 10 composed of n-type low-resistance silicon carbide. A plurality of well regions 30 composed of p-type silicon carbide are provided in a surface layer portion of the drift layer 20. A source region 40 composed of n-type silicon carbide is formed in each surface layer portion of well region 30 at a position on the surface side inside the well region 30 at a predetermined interval from the outer periphery.

The contact region 32 composed of low-resistance p-type silicon carbide is formed further inside the source region 40 in the surface layer portion of each well region 30, that is, in the surface layer portion of the well region 30 on the opposite side of the boundary with the drift layer 20, and on the surfaces of the source region 40 and the contact region 32, a source electrode 70 is formed.

A gate insulating film 50 is formed on the surface of the source region 40 in the well region 30, and a gate electrode 60 is formed on the gate insulating film 50 at least above the well region 30. Below the portion where the gate electrode 60 is formed, the surface layer portion of the well region 30 opposed via the gate insulating film 50 is a channel region.

Further, an interlayer insulating film 55 is formed between the gate electrode 60 and the source electrode 70. A drain electrode 80 is formed on the back surface of the semiconductor substrate 10 opposite to the drift layer 20.

Further, nitrogen is added at a high concentration to the interface between the surface layer portion of the well region 30 serving as a channel region and the gate insulating film 50, and the nitrogen concentration at this interface is $1 \times 10^{20}$ cm$^{-3}$ or more.

Here, in the silicon carbide MOSFET according to Embodiment 1 of the present invention, a sulfur-containing region 90 to which sulfur is added is formed on the gate insulating film 50 side of each of the drift layer 20, the well region 30, the source region 40, and the contact region 32.

Figure 2:
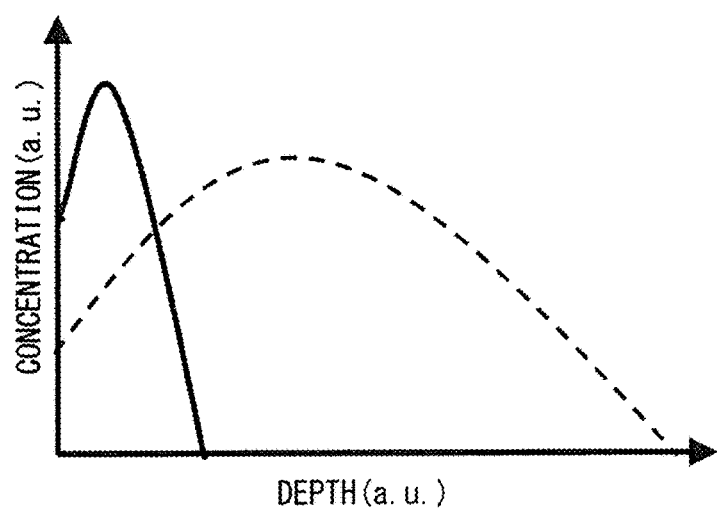
FIG. 2 A schematic diagram of a sulfur and p-type impurity concentration distribution in a depth direction of a channel region of the silicon carbide semiconductor device according to Embodiment 1 of the present invention.

FIG. 2 is a schematic diagram of a sulfur and p-type impurity concentration distribution in a depth direction of a channel region of the MOSFET according to Embodiment 1 of the present invention. The solid line indicates sulfur concentration distribution, and the broken line indicates concentration distribution of p-type impurities such as aluminum (Al). As illustrated in FIG. 2, sulfur is distributed at a high concentration on the surface side of the well region 30, and near the surface, the sulfur has a higher concentration than the p-type impurities. The sulfur is distributed in the well region 30 within at least 10 nm from the interface between the gate insulating film 50 and the well region 30.

Figure 3:
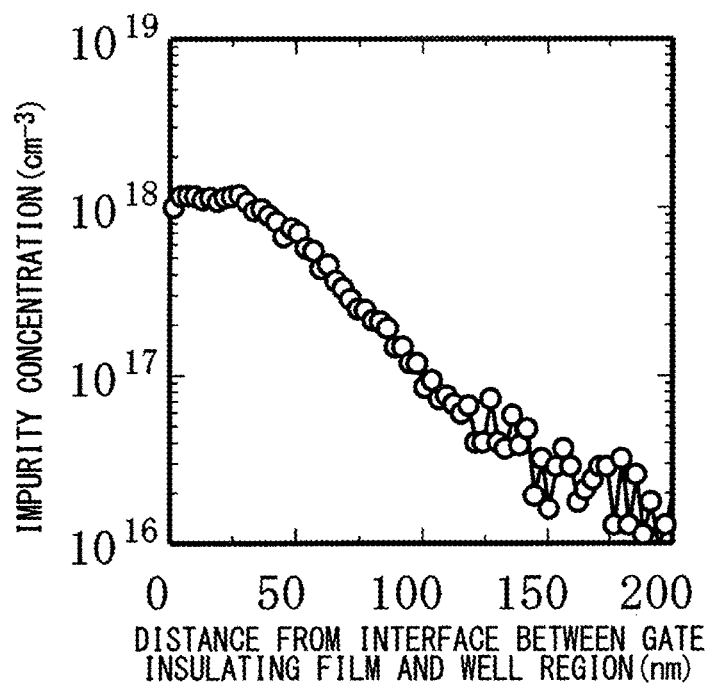
FIG. 3 A diagram of a sulfur concentration distribution in a depth direction of a channel region of the silicon carbide semiconductor device according to Embodiment 1 of the present invention.
Figure 4:
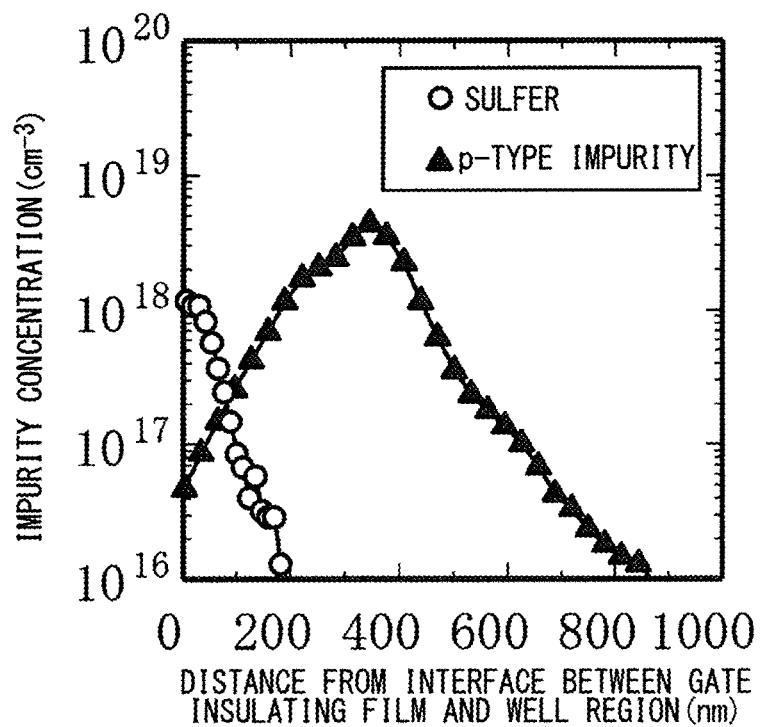
FIG. 4 A diagram of a sulfur and p-type impurity concentration distribution in a depth direction of a channel region of the silicon carbide semiconductor device according to Embodiment 1 of the present invention.

Sulfur has, for example, an impurity profile as illustrated in FIG. 3. FIG. 3 is an example of the sulfur concentration distribution in the depth direction of the channel region. In this case, the peak concentration of sulfur is $1.1 \times 10^{18}$ cm$^{-3}$, and the concentration of sulfur is $1 \times 10^{16}$ cm$^{-3}$ or more from the interface between the gate insulating film 50 and the well region 30 to about 200 nm. This sulfur concentration is, for example, about $1 \times 10^{18}$ cm$^{-3}$ at the interface where the gate insulating film 50 and the well region 30 are in contact, and is higher than the n-type impurity concentration of the drift layer 20. FIG. 4 illustrates an example of the concentration distribution of sulfur and p-type impurities in the depth direction. Here, for example, the peak concentration of the p-type impurity is $4 \times 10^{18}$ cm$^{-3}$, and the p-type impurities having a concentration of $1 \times 10^{16}$ cm$^{-3}$ or more from the interface between the gate insulating film 50 and the well region 30 to a depth of about 850 nm are present. As described above, at the interface where the gate insulating film 50 and the well region 30 are in contact, the sulfur concentration is about $1 \times 10^{18}$ cm$^{-3}$, which is higher than the p-type impurity concentration.

Next, a manufacturing method of a SiC-MOSFET as a silicon carbide semiconductor device of Embodiment 1 will be described.

First, on a semiconductor substrate 10 made of n-type low-resistance silicon carbide whose plane orientation of the first main surface is a (0001) plane having an off angle and having a 4H polytype, a drift layer 20 made of n-type silicon carbide having a thickness of 5 μm or more and 100 μm or less with an impurity concentration of $1 \times 10^{14}$ cm$^{-3}$ or more and $1 \times 10^{17}$ cm$^{-3}$ or less is epitaxially grown by chemical vapor deposition (CVD) method.

Subsequently, an implantation mask is formed using a photoresist or the like in a predetermined region on the surface of the drift layer 20, and aluminum (Al), which is p-type impurities, is ion-implanted. At this time, the depth of the Al ion implantation is set to about 0.5 to 3 μm which does not exceed the thickness of the drift layer 20. The impurity concentration of the ion-implanted Al is in the range of $1 \times 10^{15}$ cm$^{-3}$ or more to $1 \times 10^{19}$ cm$^{-3}$ or less and higher than the n-type impurity concentration of the drift layer 20. After that, the implantation mask is removed. The region into which Al has been ion-implanted by the step is the well region 30.

Next, an implantation mask is formed with a photoresist or the like so that a predetermined portion inside the well region 30 on the surface of the drift layer 20 is opened, and nitrogen (N) as n-type impurities is ion-implanted. The ion implantation depth of N is shallower than the thickness of the well region 30. The impurity concentration of ion-implanted N is in the range of $1\times10^{18}$ $cm^{-3}$ or more to $1\times10^{21}$ $cm^{-3}$ or less, and exceeds the p-type impurity concentration of well region 30. The region indicating n-type among the regions into which N has been implanted in the step is the source region 40.

An implantation mask is formed using a photoresist or the like on the surface of the drift layer 20, and Al, which is p-type impurities, is ion-implanted. The depth of the Al ion implantation is set to about 0.5 to 3 μm which does not exceed the thickness of the drift layer 20. The impurity concentration of the ion-implanted Al is in the range of $1\times10^{18}$ $cm^{-3}$ or more to $1\times10^{21}$ $cm^{-3}$ or less and higher than the n-type impurity concentration of the drift layer 20 and the p-type impurity concentration of the well region 30. After that, the implantation mask is removed. The region into which Al has been ion-implanted by the step is the contact region 32.

Next, sulfur (S) is ion-implanted to a predetermined depth from the surface of the drift layer 20 including the well region 30 and the source region 40. Here, the sulfur-containing region 90 into which sulfur is implanted has a depth of, for example, about 300 nm, which is 10 nm or more and 500 nm or less. Further, the sulfur concentration is $1\times10^{17}$ $cm^{-3}$ or more and $2\times10^{21}$ $cm^{-3}$ or less, for example, $1\times10^{18}$ $cm^{-3}$ in peak value. Here, the surface density of sulfur contained in the well region 30 is preferably $1\times10^{11}$ $cm^{-2}$ or more and $1\times10^{14}$ $cm^{-2}$ or less, for example, $5\times10^{11}$ $cm^{-2}$ or more and $1\times10^{13}$ $cm^{-2}$ or less.

Subsequently, annealing is performed at a temperature of 1300 to 1900° C. for 30 seconds to 1 hour under the atmosphere of an inert gas such as an argon (Ar) gas by a heat treatment apparatus. The annealing electrically activates the implanted ions.

Next, the surface of the drift layer 20 including the well region 30 and the source region 40 is thermally oxidized to form a silicon oxide film as gate insulating film 50 having a desired thickness. When the gate insulating film 50 is formed, nitridization is performed in a gas containing nitrogen in order to reduce defects at the interface between the gate insulating film 50 and the channel region. Subsequently, a polycrystalline silicon film having conductivity is formed on the gate insulating film 50 by the low-pressure CVD method, and the gate electrode 60 is formed by patterning the polycrystalline silicon film. Next, an interlayer insulating film 55 made of silicon oxide is formed by the low-pressure CVD method. Subsequently, a source electrode 70 is formed in a region where the interlayer insulating film 55 and the gate insulating film 50 have been removed. On the back surface side of the semiconductor substrate 10, a drain electrode 80 is formed. Thus, the silicon carbide semiconductor device of the Embodiment 1 illustrated in FIG. 1 is completed.

Next, electrical characteristics of a SiC-MOSFET as the silicon carbide semiconductor device of Embodiment 1 will be described.

Figure 5:
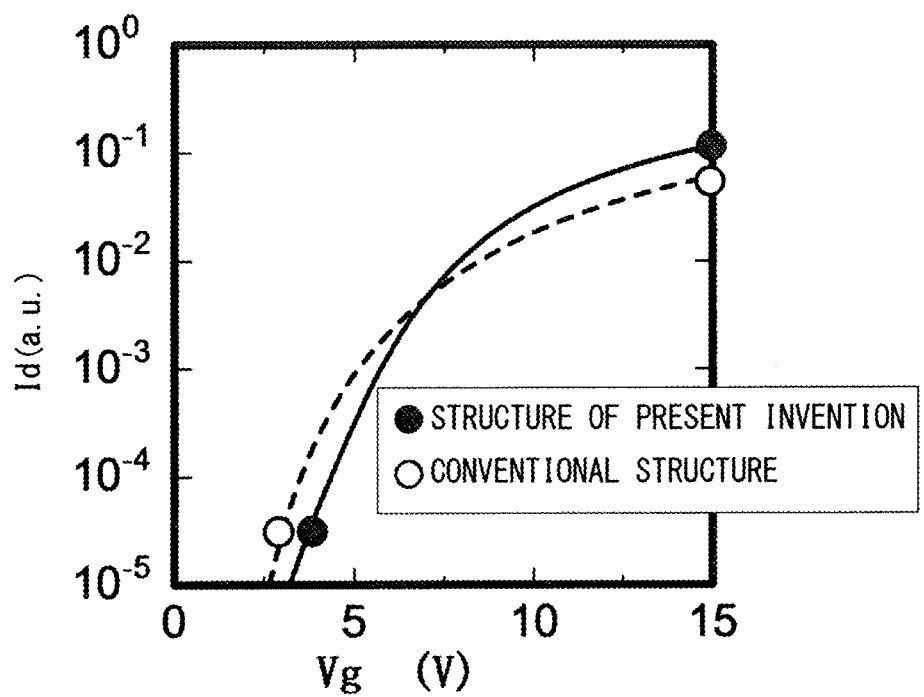
FIG. 5 An Id-Vg characteristic diagram of the silicon carbide semiconductor device according to Embodiment 1 of the present invention.

FIG. 5 illustrates the Id-Vg characteristics of the silicon carbide semiconductor device of Embodiment 1 in comparison with a silicon carbide semiconductor device having a conventional structure with no addition of sulfur. The horizontal axis indicates the gate voltage, and the vertical axis indicates the drain current.

In FIG. 5, in contrast to the characteristics of the conventional structure indicated by the broken line, the characteristics of the structure of the present invention indicated by the solid line illustrates that the threshold voltage increases and the drain voltage increases.

Figure 6:
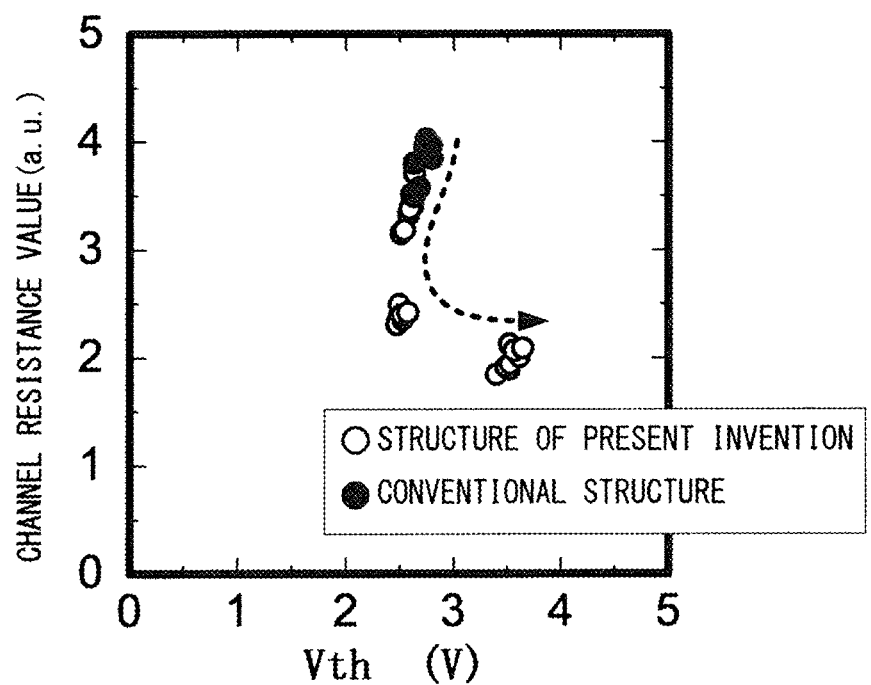
FIG. 6 A diagram illustrating a relationship between a threshold voltage and a channel resistance value of the silicon carbide semiconductor device according to Embodiment 1 of the present invention.

FIG. 6 illustrates the relationship between the threshold voltage (Vth) and the channel resistance value of the silicon carbide semiconductor device of Embodiment 1 in comparison with a silicon carbide semiconductor device having a conventional structure with no addition of sulfur. The horizontal axis indicates the threshold voltage, and the vertical axis indicates the channel resistance value.

In FIG. 6, the characteristics of the structure of the present invention indicated by white circles are different from those of the conventional structure indicated by black circles in that the threshold voltage is widely distributed and the channel resistance is low. Here, in the structure of the present invention indicated by white circles, the concentration of added sulfur increases along the direction of the dashed arrow. In the range illustrated in FIG. 6, in the range in which the concentration of sulfur to be added is low, the characteristics are the same as those in which sulfur is not added, however, as the concentration of sulfur to be added increases, the threshold voltage increases, and the channel resistance value decreases. Thus, the threshold voltage can be controlled by the concentration of sulfur to be added.

Figure 7:
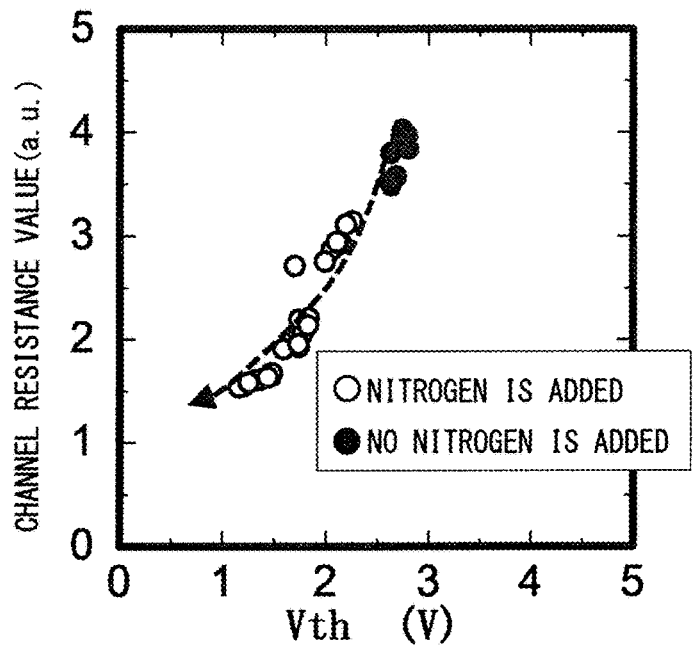
FIG. 7 A diagram illustrating a relationship between a threshold voltage and a channel resistance value of the silicon carbide semiconductor device of a comparative example with respect to the silicon carbide semiconductor device of Embodiment 1 of the present invention.

FIG. 7 is a diagram illustrating the relationship between the threshold voltage and the channel resistance of a case where nitrogen is added to the surface of the channel region for comparison with the SiC-MOSFET of Embodiment 1.

In FIG. 7, the channel resistance is reduced by adding nitrogen to the surface layer portion of the channel region, and the data shows that nitrogen is increased along in the direction of the dashed arrow. Here, although the channel resistance is reduced by adding nitrogen, the threshold voltage is also reduced, when driving the SiC-MOSFET of Embodiment 1 so that the gate voltage is turned off at 0 V as normally-off, even when an off voltage is applied to the gate electrode, the SiC-MOSFET may not be sufficiently turned off.

On the other hand, in the SiC-MOSFET according to Embodiment 1, as illustrated in FIG. 6, by adding sulfur, the threshold voltage can be increased while the channel resistance is lowered so that a highly reliable SiC-MOSFET with low resistance can be obtained.

Such an effect is produced, due to the increase in sulfur in the channel region, negative fixed charge increases with increasing defect levels at energy levels 0.2-0.6 eV below the conduction band of silicon carbide at the interface between the channel region and the gate insulating film, and electrons are captured on the impurity levels formed by sulfur in silicon carbide. In addition, by introducing sulfur into the channel region, the sulfur acts as n-type impurities (donor), and this reduces the electric field at the interface between the gate insulating film and the channel region, so that the mobility of electrons in the channel region is improved.

Figure 8:
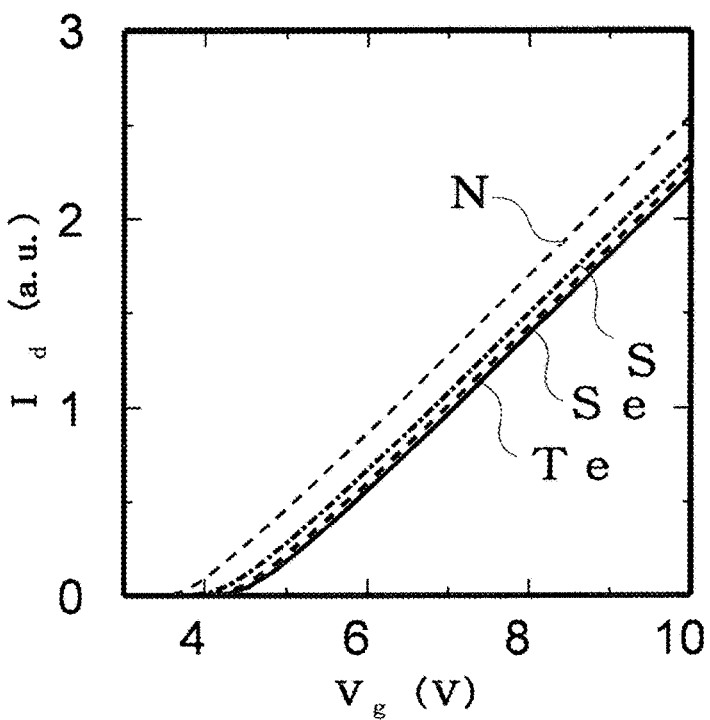
FIG. 8 An Id-Vg characteristic nomogram of the silicon carbide semiconductor device according to Embodiment 1 of the present invention.

Such an effect is also produced by adding selenium (Se) or tellurium (Te) which acts as n-type impurities in silicon carbide and forms the impurity levels deeper than sulfur. FIG. 8 illustrates an Id-Vg characteristic nomogram when nitrogen, sulfur, selenium, and tellurium are added as n-type impurities to the channel region. It can be understood that the threshold voltage increases when sulfur, selenium and tellurium are added as compared with the case where nitrogen is added. Table 1 illustrates the ionization energies corresponding to each element used in this calculation.

Sources of ionization energy values are T. Kimoto et al. Jpn. J. Appl. Phys. 54 040103 (2015), S. A. Reshanov et al., J. Appl. Phys. 99, 123717 (2006), S. A. Reshanov et al., Mater. Sci. Forum 556-557, pp. 607-610 (2007).

TABLE 1

| Element | Nitrogen | Sulfur | Selenium | Tellurium |
|---|---|---|---|---|
| Ionization energy (meV) | 61 | 260 | 335 | 380 |

Figure 9:
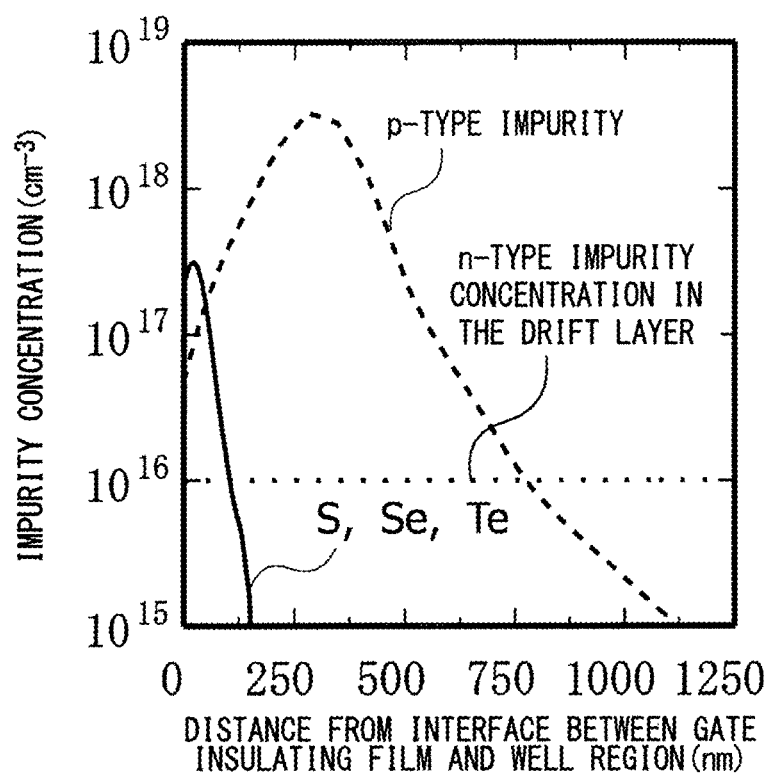
FIG. 9 A diagram of a sulfur, selenium or tellurium, and p-type impurity concentration distribution in a depth direction of a channel region of the silicon carbide semiconductor device according to Embodiment 1 of the present invention.

As described above, the threshold voltage is increased with the use of sulfur, selenium, and tellurium because these elements have a high ionization energy in silicon carbide, and thus electrons are captured on the impurity levels the elements form in silicon carbide. FIG. 9 illustrates the concentration distribution in the depth direction of sulfur, selenium, tellurium, and p-type impurities in the channel region used for the calculation.

When selenium is used instead of sulfur, the sulfur-containing region 90 of Embodiment 1 is a selenium-containing region 91. Further, when tellurium is used instead of sulfur, the sulfur-containing region 90 of Embodiment 1 is a tellurium-containing region 92.

The activation annealing after the addition of ion may be performed simultaneously with the activation annealing of Al, N, or the like, or may be performed separately. Further, the order of the implantation of sulfur and the implantation of Al and N may be interchanged. Activation annealing after sulfur implantation may be performed simultaneously with activation annealing of other ions, or may be performed separately.

Further, in Embodiment 1, although an example in which sulfur is added by ion implantation has been described, sulfur may be added during epitaxial growth of a silicon carbide layer.

Embodiment 2

The silicon carbide semiconductor device which is the SiC-MOSFET of Embodiment 2 is a so-called channel epi structure SiC-MOSFET. In Embodiment 2, a SiC-MOSFET having a channel epi structure will be described. The other points are the same as those in Embodiment 1, and thus detailed description will be omitted.

Figure 10:
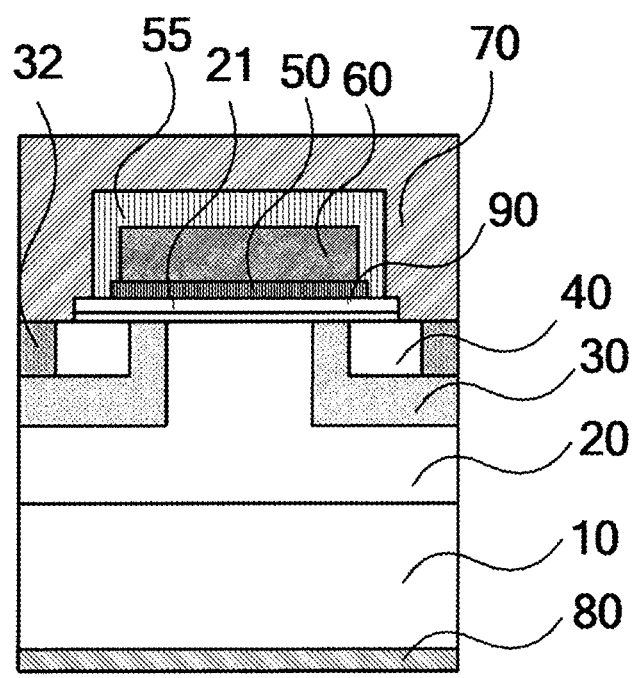
FIG. 10 A schematic cross-sectional view of a silicon carbide semiconductor device according to Embodiment 2 of the present invention.

FIG. 10 is a schematic cross-sectional view of a SiC-MOSFET that is a silicon carbide semiconductor device according to Embodiment 2. In FIG. 10, on a drift layer 20, a pair of well regions 30 in which the well region 30 and a source region 40 are formed and a channel epi layer 21 formed on the well regions 30, the source regions 40 and the drift layer 20 so as to connect the source regions 40 is formed. On the channel epi layer 21, a gate insulating film 50 and a gate electrode 60 are formed similarly to the SiC-MOSFET of Embodiment 1.

The channel epi layer 21 is formed by a CVD method so as to epitaxially grow on a layer therebelow. The channel epi layer 21 is made of silicon carbide, which is n-type, p-type, or i-type, and has a thickness of 5 nm or more and 200 nm or less. In the case of n-type and p-type, the impurity concentration is $1\times10^{15}$ cm$^{-3}$ or more and $2\times10^{18}$ cm$^{-3}$ or less.

In the SiC-MOSFET of Embodiment 2, the sulfur-containing region 90 containing sulfur is formed within a predetermined thickness from the interface of the channel epi layer 21 from a gate insulating film 50. Sulfur is added within a range of at least 10 nm from the interface of the channel epi layer 21 from the gate insulating film 50.

Next, a manufacturing method of the SiC-MOSFET that is a silicon carbide semiconductor device of Embodiment 2 will be described.

First, on a semiconductor substrate 10 made of n-type low-resistance silicon carbide whose plane orientation of the first main surface is a (0001) plane having an off angle and having a 4H polytype, the drift layer 20 made of n-type silicon carbide is epitaxially grown by the CVD method.

Subsequently, a layer to be the well region 30 made of p-type silicon carbide is formed by epitaxial growth on the drift layer 20 or by ion implantation into the upper layer portion of the drift layer 20, and a layer serving as the source region 40 is formed by an epitaxial growth method or an implantation method. Further, a p-type region serving as a contact region 32 is formed by the ion implantation method. Next, a silicon carbide layer serving as the channel epi layer 21 is epitaxially grown on the drift layer 20, the well region 30, the source region 40, and the contact region 32 by a CVD method, and portions other than necessary portions are removed by etching. Subsequently, after sulfur is ion-implanted, activation annealing is performed under predetermined conditions. Here, the sulfur-containing region 90 into which sulfur is implanted has a depth of, for example, about 300 nm, which is 10 nm or more and 500 nm or less, and the sulfur concentration is $1\times10^{17}$ cm$^{-3}$ or more and $2\times10^{21}$ cm$^{-3}$ or less, in peak value.

Next, a gate insulating film 50, a gate electrode 60 made of low-resistance polycrystalline silicon are formed on the channel epi layer 21 and the like, and an interlayer insulating film 55 of silicon oxide, a source electrode 70, and a drain electrode 80 are formed. Thereby, a SiC-MOSFET which is the silicon carbide semiconductor device of Embodiment 2 illustrated in FIG. 10 is completed.

In the SiC-MOSFET that is a silicon carbide semiconductor device according to Embodiment 2, the threshold voltage can be increased while the channel resistance is lowered so that a highly reliable SiC-MOSFET with low resistance can be obtained similarly to the SiC-MOSFET of Embodiment 1.

Figure 11:
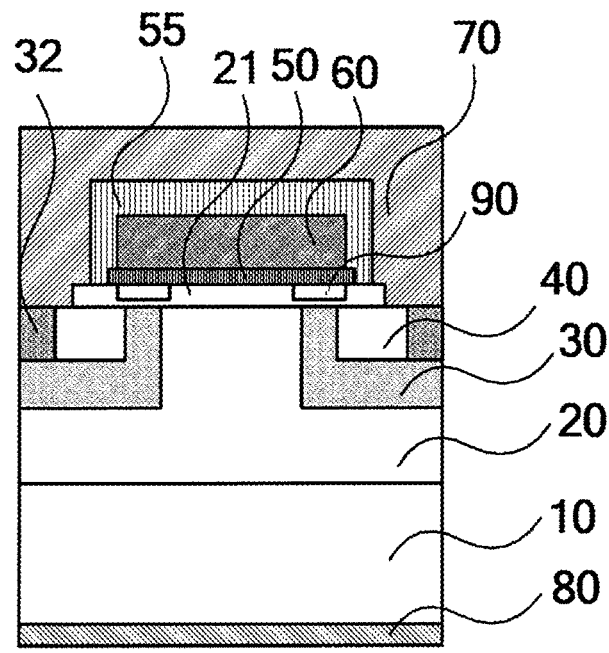
FIG. 11 A schematic cross-sectional view of the silicon carbide semiconductor device according to Embodiment 2 of the present invention.

Note that the sulfur-containing region 90 may be present on the entire surface of the channel epi layer 21 as illustrated in the schematic cross-sectional view of FIG. 10, or may be formed only on near the region where the channel region of the channel epi layer 21 is formed as illustrated in the schematic cross-sectional view of FIG. 11.

Figure 12:
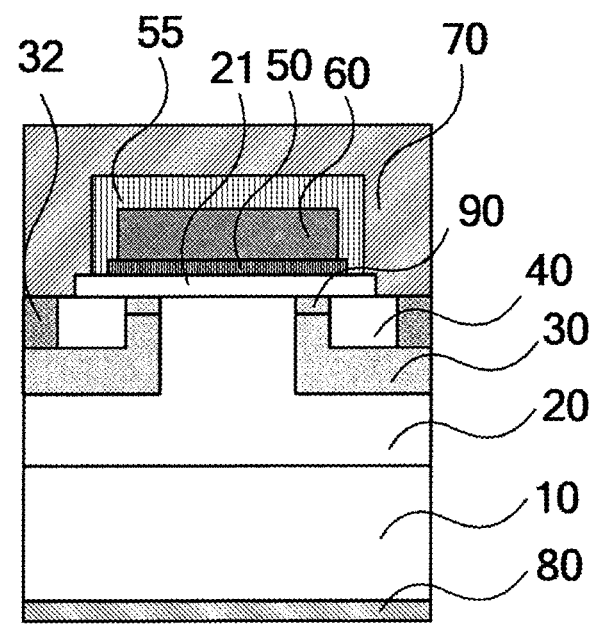
FIG. 12 A schematic cross-sectional view of the silicon carbide semiconductor device according to Embodiment 2 of the present invention.

Further, as illustrated in a schematic cross-sectional view of FIG. 12, the sulfur-containing region 90 may be formed on an upper layer portion of the well region 30. In this case, sulfur may be ion-implanted before the channel epi layer 21 is formed, or sulfur may be ion-implanted after the channel epi layer 21 is formed.

Further, as in Embodiment 1, selenium or tellurium may be used as impurities instead of sulfur. When selenium is used instead of sulfur, the sulfur-containing region 90 of Embodiment 2 is a selenium-containing region 91. Further, when tellurium is used instead of sulfur, the sulfur-containing region 90 of Embodiment 1 is a tellurium-containing region 92.

Embodiment 3

In Embodiments 1 and 2, although a silicon carbide semiconductor device of a planar type SiC-MOSFET has been described, the present invention is also effective in a silicon carbide semiconductor device of a trench type SiC-MOSFET. In Embodiment 3, a case where the silicon carbide semiconductor device is a trench SiC-MOSFET will be described. The other points are the same as those in Embodiments 1 and 2, and thus detailed description will be omitted.

Figure 13:
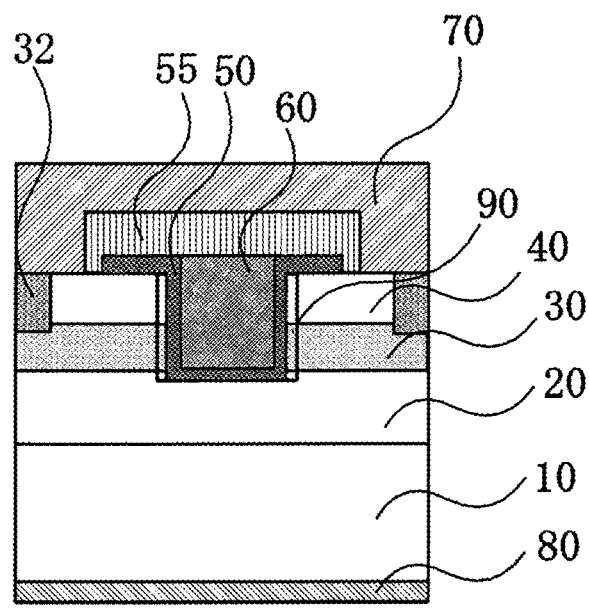
FIG. 13 A schematic cross-sectional view of the silicon carbide semiconductor device according to Embodiment 3 of the present invention.

FIG. 13 is a schematic cross-sectional view of a SiC-MOSFET that is a silicon carbide semiconductor device according to Embodiment 3. In FIG. 13, a drift layer 20 composed of n-type silicon carbide is formed on a surface of a semiconductor substrate 10 composed of n-type low-resistance silicon carbide. A well region 30 composed of p-type silicon carbide is provided on the upper side of the drift layer 20. A source region 40 composed of n-type silicon carbide is provided on the well region 30. A contact region 32 composed of low-resistance p-type silicon carbide is formed adjacent to source region 40 and connected to the well region 30 from the surface of the silicon carbide layer.

A gate trench reaching the drift layer 20 through the source region 40 and the well region 30 is formed, and a gate insulating film 50 is formed inside the trench. A gate electrode 60 is formed at least at a position inside the gate insulating film 50 opposite to the well region 30. The region of the well region 30 opposite to the portion where the gate electrode 60 is formed via the gate insulating film 50 is the channel region. In a region in contact with the gate trench including the well region 30, a sulfur-containing region 90 having a predetermined width is formed along the side wall of the gate trench.

Further, an interlayer insulating film 55 is formed so as to cover the gate electrode 60, and a source electrode 70 is formed on the interlayer insulating film 55, the source region 40, and the contact region 32. Also a drain electrode 80 is formed on the back surface of the semiconductor substrate 10 opposite to the drift layer 20.

Next, a manufacturing method of the SiC-MOSFET that is a silicon carbide semiconductor device of Embodiment 3 will be described.

First, on a semiconductor substrate 10 made of n-type low-resistance silicon carbide whose plane orientation of the first main surface is a (0001) plane having an off angle and having a 4H polytype, a drift layer 20 made of n-type silicon carbide is epitaxially grown by the chemical vapor deposition (CVD) method.

Subsequently, a layer to be the well region 30 made of p-type silicon carbide is formed by epitaxial growth on the drift layer 20 or by ion implantation into the upper layer portion of the drift layer 20, and a layer serving as the source region 40 is formed by an epitaxial growth method or an implantation method. Next, a trench reaching the drift layer 20 through the source region 40 and the well region 30 is formed. Sulfur ions are implanted into the side walls of a gate trench to form a sulfur-containing region 90. Further, a p-type region serving as the contact region 32 is formed by the ion implantation method. After sulfur is ion-implanted, activation annealing is performed under predetermined conditions.

Next, the gate insulating film 50 made of silicon oxide in the gate trench, the gate electrode 60 made of low-resistance polycrystalline silicon are formed, and the interlayer insulating film 55 of silicon oxide, the source electrode 70, and the drain electrode 80 are formed. Thereby, SiC-MOSFET which is the silicon carbide semiconductor device of Embodiment 3 illustrated in FIG. 13 is completed.

Figure 14:
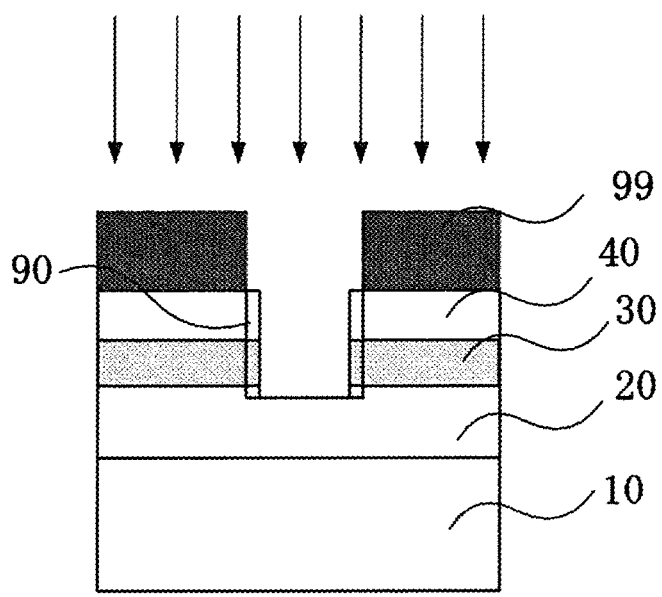
FIG. 14 A schematic cross-sectional view illustrating a manufacturing method of the silicon carbide semiconductor device according to Embodiment 3 of the present invention.

Here, the sulfur-containing region 90 containing sulfur, as illustrated in a schematic cross-sectional view of FIG. 14, may be formed by implanting ions from above the semiconductor layer after the photoresist 99 formed for etching for forming the gate trench is retracted after trench etching. The arrows in the drawing schematically illustrate ions for ion implantation.

Figure 15:
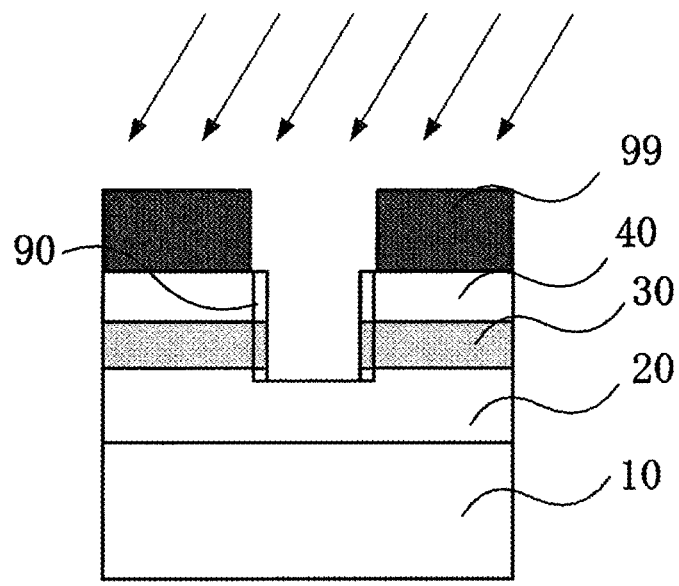
FIG. 15 A schematic cross-sectional view illustrating the manufacturing method of the silicon carbide semiconductor device according to Embodiment 3 of the present invention.

Further, as illustrated in the schematic cross-sectional view of FIG. 15, while the photoresist 99 formed for the etching for forming the gate trench is formed, the sulfur-containing region 90 may be formed by implanting sulfur into the side surface of the gate trench by an oblique ion implantation method.

Figure 16:
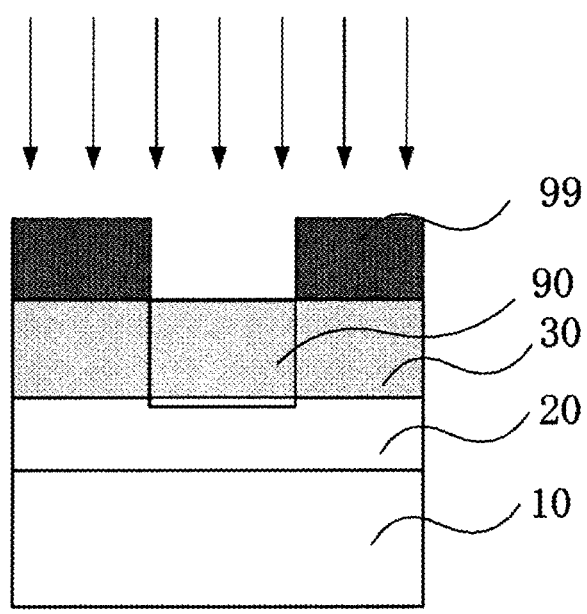
FIG. 16 A schematic cross-sectional view illustrating the manufacturing method of the silicon carbide semiconductor device according to Embodiment 3 of the present invention.

Further, as illustrated in the schematic cross-sectional view of FIG. 16, sulfur may be implanted from above the semiconductor layer before the formation of the gate trench, and then the gate trench may be formed to form the sulfur-containing region 90.

Further, similarly to Embodiment 2, a channel epi layer 21 may be formed in a region to be a channel to form a channel epi structure, and sulfur may be implanted into the region to form the sulfur-containing region 90.

Further, as in Embodiments 1 and 2, selenium or tellurium may be used as impurities instead of sulfur. When selenium is used instead of sulfur, the sulfur-containing region 90 of Embodiment 3 is a selenium-containing region 91. Further, when tellurium is used instead of sulfur, the sulfur-containing region 90 of Embodiment 3 is a tellurium-containing region 92.

In the SiC-MOSFET that is a silicon carbide semiconductor device according to Embodiment 3, the threshold voltage can be increased while the channel resistance is lowered so that a highly reliable SiC-MOSFET with low resistance can be obtained similarly to the SiC-MOSFET of Embodiment 1.

In Embodiments 1 to 3, although aluminum (Al) is used as p-type impurities, the p-type impurities may be boron (B) or gallium (Ga). The n-type impurities may be phosphorus (P) instead of nitrogen (N). In the MOSFETs described in Embodiments 1 to 3, the gate insulating film does not necessarily need to be an oxide film such as $SiO_2$, and may be an insulating film other than an oxide film, or a combination of an insulating film other than an oxide film and an oxide film. Further, although silicon oxide obtained by thermally oxidizing silicon carbide is used as the gate insulating film 50, silicon oxide of a deposited film formed by the CVD method may be used. Further, in above Embodiments, specific examples such as a crystal structure, a plane orientation of a main surface, an off angle, and respective implantation conditions have been described. However, the application range is not limited to these numerical ranges.

Also in above Embodiments, the so-called vertical MOSFET silicon carbide semiconductor device in which the drain electrode is formed on the back surface of the semiconductor substrate 10 has been described. However, the so-called horizontal MOSFET such as a RESURF type MOSFET in which the drift electrode is formed on the surface of the drift layer 20 can also be used. Further, the silicon carbide semiconductor device may be an insulated gate bipolar transistor (IGBT). Further, the silicon carbide semiconductor device can be applied to MOSFETs and IGBTs having a super junction structure.

Embodiment 4

In Embodiment 4, the silicon carbide semiconductor devices according to Embodiments 1 to 3 are applied to a power conversion apparatus. Although the present invention is not limited to a specific power conversion apparatus, a case where the present invention is applied to a three-phase inverter will be described below as Embodiment 4.

FIG. 17 is a block diagram illustrating a configuration of a power conversion system to which a power conversion apparatus according to Embodiment 4 is applied.

The power conversion system illustrated in FIG. 17 includes a power source 100, a power conversion apparatus 200, and a load 300. The power source 100 is a DC power source and supplies DC power to the power conversion apparatus 200. The power source 100 can be various types, such as a DC system, a solar cell, a storage battery, alternatively, the power source 100 may include a rectifier circuit or an AC/DC converter connected to an AC system. Further, the power source 100 may include a DC/DC converter that converts DC power output from the DC system into predetermined electric power.

The power conversion apparatus 200 is a three-phase inverter connected to the power source 100 and the load 300, and converts DC power supplied from the power source 100 into AC power then supplies the AC power to the load 300. As illustrated in FIG. 17, the power conversion apparatus 200 includes a main conversion circuit 201 that converts DC power into AC power and outputs the same, a drive circuit 202 that outputs a drive signal for driving each switching device of the main conversion circuit 201, and a control circuit 203 that outputs a control signal for controlling the drive circuit 202 to the drive circuit 202.

The drive circuit 202 controls each normally-off switching device to be off by equalizing the voltage of the gate electrode to the voltage of the source electrode.

The load 300 is a three-phase motor driven by AC power supplied from the power conversion apparatus 200. It should be noted that, the load 300 is not limited to a specific use, and is a motor mounted in various electric apparatuses, for example, the load 300 is used as a motor for hybrid vehicles, electric vehicles, railway vehicles, elevators, or air conditioning apparatuses.

Hereinafter, details of the power conversion apparatus 200 will be described. The main conversion circuit 201 includes a switching device and a freewheel diode (not illustrated), the switching device converts DC power supplied from the power source 100 into AC power by switching and supplies the power to the load 300. There are various specific circuit configurations of the main conversion circuit 201, and the main conversion circuit 201 according to Embodiment 4 is a two-level three-phase full-bridge circuit which can be composed of six switching devices and six freewheel diodes each of which is connected in antiparallel to the respective switching devices. The silicon carbide semiconductor device according to any of above-described Embodiments 1 to 3 is applied to each switching device of the main conversion circuit 201. In the six switching devices, for each pair of switching devices, an upper arm and a lower arm are formed by connecting the switching devices in series, and each pair of upper arm and lower arm constitutes each phase (U-phase, V-phase, W-phase) of the full bridge circuit. And, an output terminal of each pair of upper arm and lower arm, that is, three output terminals of the main conversion circuit 201 are connected to the load 300.

The drive circuit 202 generates a drive signal for driving each switching device of the main conversion circuit 201 and supplies the signal to a control electrode of the switching device of the main conversion circuit 201. Specifically, in accordance with the control signal from the control circuit 203 which will be described later, the drive circuit outputs a drive signal for turning each switching device to the ON state and a drive signal for turning each switching device to the OFF state to the control electrode of each switching device. When the switching device is maintained in the ON state, the drive signal is a voltage signal (ON signal) equal to or higher than a threshold voltage of the switching device, and when the switching device is maintained in the OFF state, the drive signal is a voltage signal (OFF signal) equal to or lower than the threshold voltage of the switching device.

The control circuit 203 controls the switching devices of the main conversion circuit 201 so that desired power is supplied to the load 300. Specifically, the control circuit 203 calculates the time (ON time) at which each switching device of the main conversion circuit 201 should be in the ON state based on the power to be supplied to the load 300. For example, the main conversion circuit 201 can be controlled by PWM control for modulating the ON time for the switching devices according to the voltage to be output. Then, a control command (control signal) is output to the drive circuit 202 so that an ON signal is output to the switching devices to be ON state and an OFF signal is output to the switching devices to be OFF state at each point of time. In accordance with the control signal, the drive circuit 202 outputs the ON signal or the OFF signal as the drive signal to the control electrode of each switching device.

In the power conversion apparatus according to Embodiment 4, the silicon carbide semiconductor devices according to Embodiments 1 to 3 are applied as switching devices of the main conversion circuit 201; therefore, a power conversion apparatus with low loss and high reliability in high-speed switching can be realized.

In Embodiment 4, although an example in which the present invention is applied to a two-level three-phase inverter has been described, the present invention is not limited thereto and can be applied to various power conversion apparatuses. In Embodiment 4, although a two-level power conversion apparatus is applied, a three-level or multi-level power conversion apparatus may be applied, and when supplying power to a single-phase load, the present invention may be applied to a single-phase inverter. In the case where power is supplied to a direct current load and so forth, the present invention can also be applied to a DC/DC converter or an AC/DC converter.

In addition, the power conversion apparatus to which the present invention is applied is not limited to the case where the above-described load is an electric motor, and may be applied to, for example, power source equipment of an electric discharge machine, a laser processing machine, an induction heating cooker or a non-contact power supply system, and further, can also be used as a power conditioner for a photovoltaic power generation system, a power storage system or the like, for example.

The invention claimed is:
1. A silicon carbide semiconductor device comprising:
a semiconductor substrate composed of silicon carbide;
a drift layer formed on the semiconductor substrate and composed of a silicon carbide semiconductor of n-type;
a well region of p-type formed on a surface layer of the drift layer;
a source region of n-type formed on a surface side in the well region and separated from the drift layer;
a gate insulating film formed in contact with the source region, the well region, and the drift layer;
a gate electrode formed in contact with the gate insulating film and opposite to the well region;
a source electrode connected to the source region; and
a drain electrode connected to the semiconductor substrate, wherein sulfur is contained in the well region within a predetermined thickness from an interface of the well region with the gate insulating film.

2. The silicon carbide semiconductor device according to claim 1, wherein
the predetermined thickness is 10 nm.

3. The silicon carbide semiconductor device according to claim 1, wherein
concentration of sulfur in the well region at a location in contact with the gate insulating film is higher than p-type impurity concentration in the well region.

4. The silicon carbide semiconductor device according to claim 1, wherein
concentration of sulfur in the well region at a location in contact with the gate insulating film is higher than n-type impurity concentration in the drift layer.

5. The silicon carbide semiconductor device according to claim 1, wherein
a maximum value of the concentration of sulfur in the well region within a predetermined thickness from the interface with the gate insulating film is $11 \times 10^{17}$ cm$^{-3}$ or more and $2 \times 10^{21}$ cm$^{-3}$ or less.

6. The silicon carbide semiconductor device according to claim 1, wherein
the gate electrode is located immediately above a region containing sulfur.

7. The silicon carbide semiconductor device according to claim 1, wherein
the gate electrode is formed in a trench, and opposite to a region containing sulfur via the gate insulating film.

8. A silicon carbide semiconductor device comprising:
a semiconductor substrate composed of silicon carbide;
a drift layer formed on the semiconductor substrate and composed of a silicon carbide semiconductor of n-type;
a well region of p-type formed on a surface layer of the drift layer;
a source region of n-type formed on a surface side in the well region and separated from the drift layer;
a gate insulating film formed in contact with the source region, the well region, and the drift layer;
a gate electrode formed in contact with the gate insulating film and opposite to the well region;
a source electrode connected to the source region; and
a drain electrode connected to the semiconductor substrate, wherein
any of selenium and tellurium is contained in the well region within a predetermined thickness from an interface of the well region with the gate insulating film, and
concentration of any of selenium and tellurium in the well region at a location in contact with the gate insulating film is higher than n-type impurity concentration in the drift layer.

9. The silicon carbide semiconductor device according to claim 8, wherein
the predetermined thickness is 10 nm.

10. The silicon carbide semiconductor device according to claim 8, wherein
concentration of any of selenium and tellurium in the well region at a location in contact with the gate insulating film is higher than p-type impurity concentration in the well region.

11. The silicon carbide semiconductor device according to claim 8, wherein
a maximum value of the concentration of any of selenium and tellurium in the well region within a predetermined thickness from the interface with the gate insulating film is $1 \times 10^{17}$ cm$^{-3}$ or more and $2 \times 10^{21}$ cm$^{-3}$ or less.

12. The silicon carbide semiconductor device according to claim 8, wherein
the gate electrode is located immediately above a region containing any of selenium and tellurium.

13. The silicon carbide semiconductor device according to claim 8, wherein
the gate electrode is formed in a trench, and opposite to a region containing any of selenium and tellurium via the gate insulating film.

14. A silicon carbide semiconductor device comprising:
a semiconductor substrate made of silicon carbide;
a drift layer formed on the semiconductor substrate and made of a silicon carbide semiconductor of n-type;
a well region of p-type formed on a surface layer of the drift layer;
a channel epi layer formed on a surface of the well region;
a source region of n-type formed on a surface side in the well region and separated from the drift layer;
a gate insulating film formed in contact with the channel epi layer;
a gate electrode formed in contact with the gate insulating film and opposite to the channel epi layer;
a source electrode connected to the source region; and
a drain electrode connected to the semiconductor substrate, wherein
at least any of sulfur, selenium, and tellurium is contained in the channel epi layer or the well region within a predetermined thickness from an interface of the channel epi layer with the gate insulating film.

15. The silicon carbide semiconductor device according to claim 14, wherein
the predetermined thickness is 10 nm.

16. The silicon carbide semiconductor device according to claim 14, wherein
at least any of sulfur, selenium, and tellurium is contained in the well region.

17. The silicon carbide semiconductor device according to claim 14, wherein
the gate electrode is located immediately above a region containing at least any of sulfur, selenium, and tellurium.

18. The silicon carbide semiconductor device according to claim 14, wherein
the gate electrode is formed in a trench, and opposite to a region containing at least any of sulfur, selenium, and tellurium via the gate insulating film.

* * * * *